United States Patent
Heinz et al.

(10) Patent No.: US 6,765,337 B1
(45) Date of Patent: Jul. 20, 2004

(54) PIEZOELECTRIC ACTUATOR

(75) Inventors: Rudolf Heinz, Renningen (DE); Klaus-Peter Schmoll, Lehrensteinsfeld (DE); Friedrich Böcking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 433 days.

(21) Appl. No.: 09/381,755

(22) PCT Filed: Oct. 21, 1998

(86) PCT No.: PCT/DE98/03075

§ 371 (c)(1),
(2), (4) Date: Sep. 22, 1999

(87) PCT Pub. No.: WO99/38220

PCT Pub. Date: Jul. 29, 1999

(30) Foreign Application Priority Data

Jan. 22, 1998 (DE) ......................... 198 02 302

(51) Int. Cl.[7] .............................................. H01L 41/08
(52) U.S. Cl. ....................................... 310/328; 310/366
(58) Field of Search ................................ 310/328, 365, 310/366

(56) References Cited

U.S. PATENT DOCUMENTS

| | | | | |
|---|---|---|---|---|
| 4,752,712 A | * | 6/1988 | Tomita et al. ............. | 310/328 |
| 5,153,477 A | | 10/1992 | Shigeru et al. | |
| 5,155,409 A | * | 10/1992 | Swanson et al. ........ | 310/328 X |
| 5,278,471 A | * | 1/1994 | Uehara et al. ............. | 310/328 |
| 5,345,137 A | * | 9/1994 | Funakubo et al. ....... | 310/328 X |
| 5,485,437 A | * | 1/1996 | Gregg .................... | 310/328 X |
| 6,064,142 A | * | 5/2000 | Yamamoto .............. | 310/366 X |

FOREIGN PATENT DOCUMENTS

| | | |
|---|---|---|
| DE | 35 33 085 | 3/1987 |
| DE | 37 13 697 | 10/1988 |
| DE | 38 00 203 | 7/1989 |
| EP | 0 361 480 | 4/1990 |
| EP | 0 477 400 | 4/1992 |
| JP | 04 197086 | 7/1992 |
| JP | 08 242023 | 9/1996 |

* cited by examiner

Primary Examiner—Mark O. Budd
(74) Attorney, Agent, or Firm—Kenyon & Kenyon

(57) ABSTRACT

A piezoelectric actuator having a plurality of plates of a piezoelectric material whose polarization direction runs perpendicularly to the plate plane, and which are stacked one over another in their polarization direction. The piezoelectric actuator includes a control voltage source having two contacts, two groups of at least two outer electrodes, respectively, and a plurality of internal electrodes which, in each case, are arranged between the piezoelectric plates. In this context, the outer electrodes of the first group are electrically connected to a first contact of control voltage source, and the outer electrodes of the second group to the second contact of control voltage source. Internal electrodes alternately contact outer electrodes in such a way that, in each case, an internal electrode is electrically connected to one contact of control voltage source, and the internal electrode that is next in the stacking direction is electrically connected to the other contact of control voltage source. The internal electrodes contact the outer electrodes in a cyclic sequence.

6 Claims, 3 Drawing Sheets

PIEZOELECTRIC ACTUATOR

BACKGROUND INFORMATION

The present invention is based on a piezoelectric actuator as is known, for example, from German Published Patent Application No. 37 13 697.

As schematically shown in FIG. 3, piezoelectric actuators are usually composed of several plates 2, "piezoelectric elements", of a piezoelectric material arranged stack-like one over another, the stacking direction being selected to run in the joint polarization direction of the piezoelectric plates 2. At two side faces of the stack, i.e., the piezo stack, in each case one outer electrode 3, 4 is attached, respectively, which can be electrically connected to a contact 12a, 12b of a control voltage source 11. Internal electrodes 7, 9 of piezoelectric actuator 1 are arranged between the piezoelectric plates 2, respectively. Internal electrodes 7, 9 are electrically plated through alternately to only one of the outer electrodes 3, 4, respectively, so that neighboring internal electrodes 7 and 9 arranged one over another are electrically connected to the different contacts 12a, 12b of control voltage source 11, respectively.

In this arrangement of a piezoelectric actuator, each piezoelectric element 2 is joined to an electrode 7, 9 on both plate surfaces, it being possible to apply a voltage to the electrodes via outer electrodes 3, 4. When the voltage is applied, each of the plate-like piezoelectric elements 2 arranged stack-like one over another expands in the direction of the electrical field developing between electrodes 7, 9, whose direction coincides with the polarization direction of piezoelectric plates 2. Due to the great number of stacked piezoelectric elements 2, it is possible to achieve a relatively long stroke of the overall arrangement, using a relatively low control voltage at the same time.

Piezoelectric actuators of the type above described can be used for various purposes such as for actuating a valve-closure member of a fuel injector, for actuating hydraulic valves, for driving micropumps, for actuating electrical relays and the like. Various such uses are already known from the related art.

European Patent No. 0 361 480, for example, describes a fuel injection nozzle for combustion engines in which the valve needle is set in lifting movements for opening and closing the injection nozzle. In this context, the driving element for these lifting movements is composed of a stack of plates capable of being piezoelectrically excited which are provided with flat electrodes.

A further injector for fuel-injection systems in internal combustion engines such as direct-injection diesel engines and the like, is known from German Published Patent Application No. 35 33 085, which has also a piezoelectrical final control element for opening and closing the valve by a lifting movement, i.e., displacing the valve needle. Here, the piezoelectrical final control element is also composed of a plurality of plate-shaped piezoelectric elements and can be axially expanded or contracted by an applied voltage in a very short time.

Furthermore, German Published Patent Application No. 38 00 203 describes a fuel injector having a piezoceramic valve control element composed of piezoelectric ceramic plates stacked one over another, having voltage feed lines to each piezoelectric ceramic plate. The special feature of the piezoelectric actuator used for this injector is that paired ceramic plates of opposite polarization are stacked one over another for enlarging the travel of the piezoceramic valve in this way.

A further use of piezoelectric actuators described in European Published Patent Application No. 0 477 400 relates to an arrangement for a travel transformer of a piezoelectric actuator for enlarging the stroke of the piezo-electric actuator.

In the above documents cited by way of example, each of which discloses a possible use of piezoelectric actuators of the type specified at the outset, the design and the method of functioning of the used piezoelectric actuators are, in fact, not described in detail, however, they essentially correspond to those of the actuators above described on the basis of FIG. 3.

In the case of conventional piezoelectric actuators, because of the connection of the stacked piezoelectric elements 2 and internal electrodes 7, 9 to the two outer electrodes 3, 4, the piezoelectrically generated expansion mainly occurs only in the central area where internal electrodes 7 and 9 are opposed. In edge zones 13, where internal electrodes 7 and 9 are not directly opposed, an area exhibiting changed field strength, and, consequently, also tensile stress forms. Frequently, cracks form in such actuators because of this tensile stress. The formation of such cracks is further explained in the following on the basis of FIGS. 4A and B. In this context, FIG. 4A shows actuator 1 in the neutral state, i.e., without applied control voltage, and FIG. 4B shows actuator 1 in operation, i.e., with applied control voltage and resulting expansion of piezoelectric elements 2.

FIGS. 4A and 4B show section IV of a conventional piezoelectric actuator according to FIG. 3 in an enlarged view. In the boundary region between the stack of piezoelectric elements 2 and internal electrodes 7, 9 and outer electrodes 3, 4, two areas 13, 14 can be distinguished. In the one area 13, internal electrode 7 is not plated through to outer electrode 4, and the ceramic normally used for piezoelectric element 2 is sintered through in this area 13. In the other area 14, internal electrode 9 is led through to outer electrode 4 but does not contact the other outer electrode 3. The adhesive strength in the second area 14, i.e., between piezoelectric element 2 and internal electrode 9 is by a factor of 3 to 5 less than the adhesive strength in area 13 within the piezoelectric material. As shown in FIG. 4B, applying a control voltage produces expansions which are greater in the middle of actuator 1 than in the boundary region to the outer electrodes. Due to the resulting high tensile stress in areas 13, 14 of actuator 1, cracks 15 form frequently along the boundary between internal electrodes 9 and piezoelectric elements 2 in area 14. During the continued operation of actuator 1, these cracks 15 extend into outer electrode 4, whereby the contacting of internal electrodes 9 is, at least partially, considerably deteriorated or even interrupted, thus reducing the overall expansion of actuator 1.

SUMMARY OF THE INVENTION

The piezoelectric actuator according to the present invention has the advantage that, because of the actuator design having two groups of at least two outer electrodes, respectively, the areas where the internal electrodes are plated through to the outer electrodes are distributed over more side faces of the actuator, consequently spaced further from each other in the stacking direction, and, at the same time, it being possible to sinter through three edge zones at each internal electrode. By this measure, the tensile stress in the actuator can be reduced, thus markedly diminishing the cracking tendency in general and, in particular, in the edge zones. A further advantage of the present invention is that the heat dissipation of the actuator is markedly improved by using a total of four outer electrodes.

The cyclic contacting sequence between the internal electrodes and the different outer electrodes is particularly advantageous. As a result, the throughplating areas are uniformly distributed over the entire actuator and maximally spaced from each other at the same time, thus considerably facilitating the possibilities of bridging cracks in the outer electrodes in the event of a possible formation of cracks. According to a refinement of the present invention, undulated electrodes are mounted to the outer surfaces of the outer electrodes for such a bridging of cracks, the wavelength of the undulated electrodes being four times the distance between two consecutive internal electrodes. In conventional actuators, the wavelength would only be half as long, and there would be a risk that the undulated electrodes could be soldered to the outer electrodes in a flat-spread manner.

DETAILED DESCRIPTION

Figure 1:
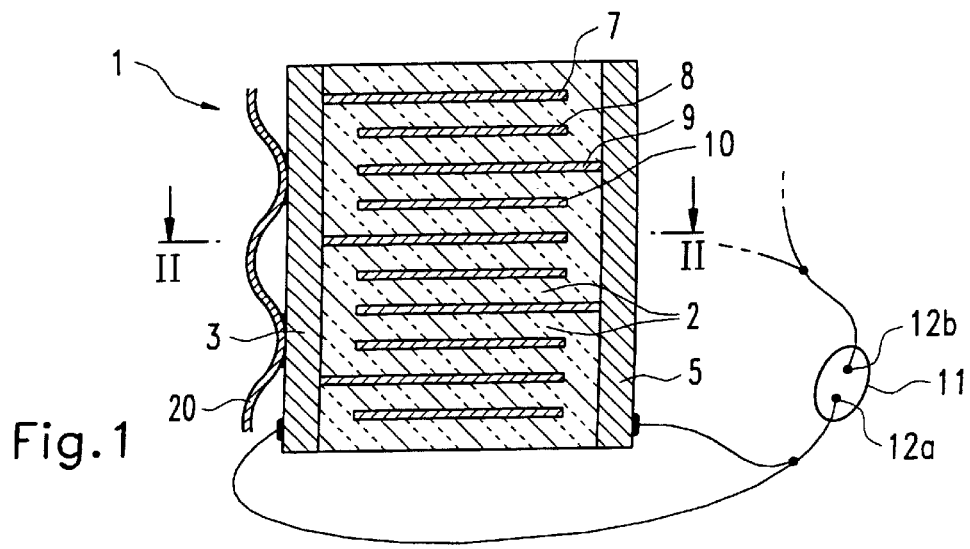
FIG. 1 shows an exemplary embodiment of a piezoelectric actuator in a sectional view along line I—I in FIG. 2A.

FIGS. 1 and 2 show, by way of example, a preferred exemplary embodiment of a piezoelectric actuator 1 according to the present invention. In this context, FIG. 1 shows piezoelectric actuator 1 in a sectional view along line I—I in FIG. 2A; and FIGS. 2A through D show the arrangement of internal electrodes 7, 8, 9 and 10 according to section II—II in FIG. 1, or parallel to section II—II in FIG. 1.

As in the case of conventional piezoelectric actuators, piezoelectric actuator 1 is composed of a plurality of plates 2 of a piezoelectric material whose polarization direction runs essentially perpendicularly to the plate plane, and which are stacked one over another in their joint polarization direction to form a "piezo stack". The piezoelectric material used for piezoelectric elements 2 can include, for example, quartz, tourmaline, barium titanate ($BaTiO_3$) or special piezoelectric ceramics, such as preferably a lead circonate-lead titanate or the PZT system ($PbZrO_3$-$PbTiO_3$). Also suitable, however, are organic salts such as NaK tartrate or many other known piezoelectric materials.

In each case one internal electrode 7, 8, 9, 10 is arranged between the individual piezoelectric plates 2, respectively. At side faces 16, 17, 18, 19 of the piezo stack, in each case one outer electrode 3, 4, 5, 6 is mounted over the whole height of the piezo stack, respectively, the outer electrode being capable of being formed by a solder layer applied to the side face. Each internal electrode 7, 8, 9, 10 is contacted with only one outer electrode 3, 4, 5, 6, respectively, i.e., internal electrodes 7–10 each extend towards just one side face 16, 17, 18, or 19 in the piezo stack, respectively, while being spaced from the remaining side faces 16–19, i.e., to the remaining outer electrodes 3–6, as is shown in FIGS. 2A through 2D for the internal electrodes 7–10 following one after the other in the stacking direction. In areas 13, which are not plated through, piezoelectric ceramic 2 is sintered through.

To achieve the desired effect of piezoelectric actuator 1, the internal and outer electrodes are wired as follows. Outer electrodes 3–6 are divided into two groups 3, 5 and 4, 6, which can be electrically connected to a contact 12a or 12b of a control voltage source 11, respectively. Internal electrodes 7–10 contact outer electrodes 3–6 in such a manner that, in each case, one internal electrode 7, 9 is electrically connected to the one contact 12a of control voltage source 11, and the internal electrode 8, 10 that is next in the stacking direction is electrically connected to the other contact 12b of control voltage source 11. By this, each plate-shaped piezoelectric element 2 is joined to electrodes 7, 9 or 8, 10, respectively, on both of its plate surfaces, it being possible to apply a voltage from control voltage source 11 to the electrodes via outer electrodes 3, 5 and 4, 6, respectively. When the voltage is applied, as in the case of conventional piezoelectric actuators, each of the piezoelectric elements 2 arranged stack-like one over another expands in the direction of the electrical field developing between electrodes 7, 9 and 8, 10, whose direction coincides with the polarization direction of the piezoelectric plates 2. Due to the great number of stacked piezoelectric elements 2, it is possible to achieve a relatively long stroke of the overall arrangement, the stroke being possible only in the central area between the outer electrodes 3–6 because of the fixed connection of the stacked piezoelectric elements 2 to these outer electrodes 3–6.

It should also be observed that using a total of four outer electrodes 3–6 instead of the two outer electrodes 3–4 conventionally used, results in an improved heat dissipation of actuator 1. As is generally known, the thermal conductivity of piezoelectric ceramics is, in fact, low compared to that of metals.

Figure 4A:
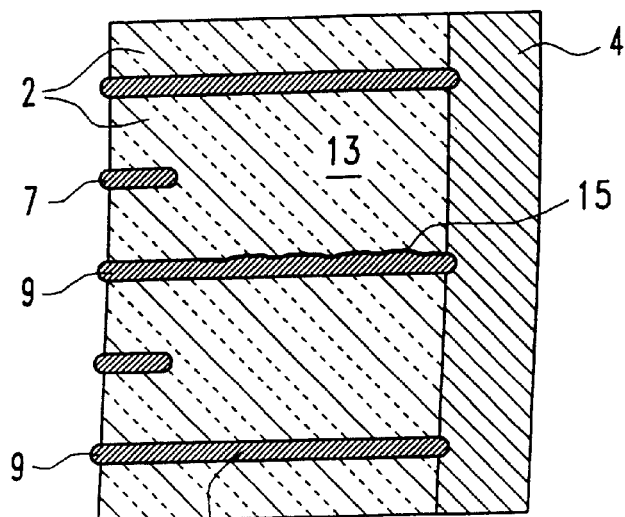
FIG. 4A shows a first illustration of detail IV of the piezoelectric actuator of FIG. 3 in an enlarged view to illustrate the formation of cracks in conventional piezoelectric actuators.

To reduce the cracking tendency in piezoelectric actuator 1, which has been explained above on the basis of FIGS. 4A and B, in a manner according to the present invention, internal electrodes 7–10 are contacted with outer electrodes 3–6 also in compliance with the following specifications. In each case, an internal electrode 7 contacts an outer electrode 3, and the internal electrodes 8, 9, and 10 that are next in the stacking direction, contact the other outer electrodes 4, 5, or 6, respectively, it being at the same time required—as described above—to electrically connect in each case an internal electrode 7, 9 to the one contact 12a of control voltage source 11 and internal electrode 8, 10 that is next in the stacking direction to the other contact 12b of control voltage source 11, respectively, to produce the piezoelectric effect in piezoelectric elements 2 by means of the developing electrical field.

Figure 2A:
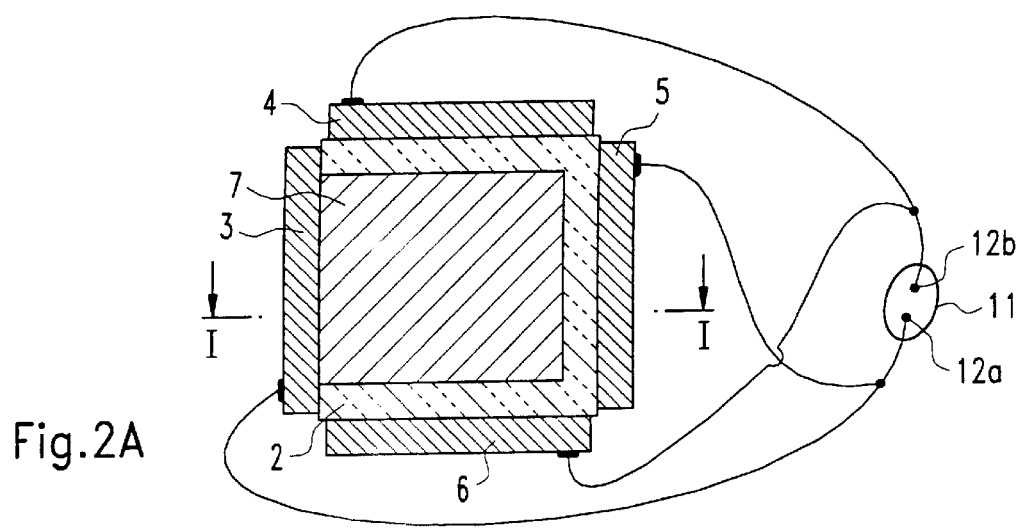
FIG. 2A is a first illustration showing the piezoelectric actuator of FIG. 1 in a top view of a first of a plurality of different planes of the internal electrodes in, or parallel to, sectional plane II—II in FIG. 1.
Figure 2B:
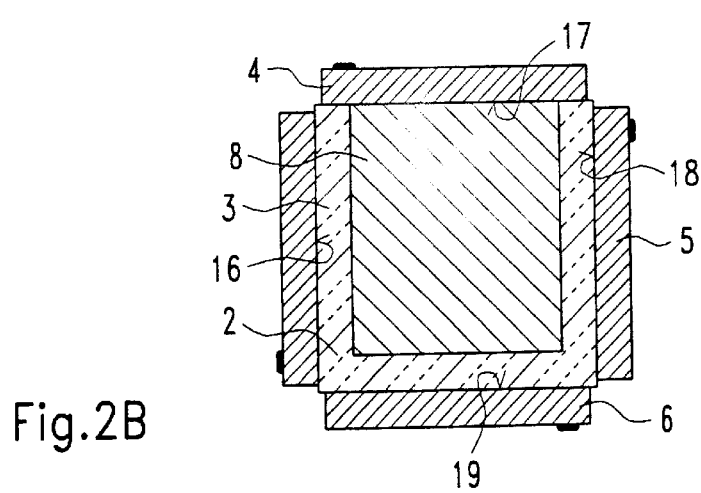
FIG. 2B is a second illustration showing the piezoelectric actuator of FIG. 1 in a top view of a second of a plurality of different planes of the internal electrodes in, or parallel to, sectional plane II—II in FIG. 1.
Figure 2C:
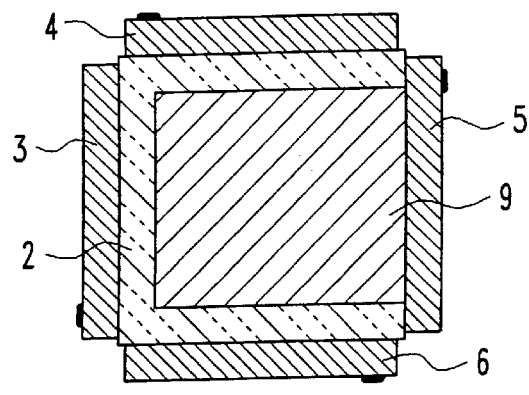
FIG. 2C is a third illustration showing the piezoelectric actuator of FIG. 1 in a top view of a third of a plurality of different planes of the internal electrodes in, or parallel to, sectional plane II—II in FIG. 1.
Figure 2D:
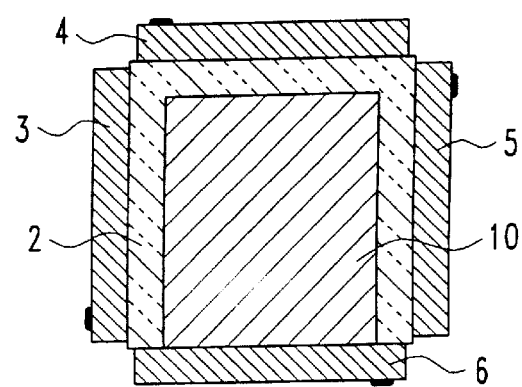
FIG. 2D is a fourth illustration showing the piezoelectric actuator of FIG. 1 in a top view of a fourth of a plurality of different planes of the internal electrodes in, or parallel to, sectional plane II—II in FIG. 1.

For the exemplary embodiment shown in FIGS. 1 and 2A through 2D, this means specifically that a first internal electrode 7 contacts a first outer electrode 3 mounted to the first side face 16 of the piezo stack, outer electrode 3 being electrically connected to the first contact 12a of control voltage source 11 (FIG. 2A), that internal electrode 8 that is next in the stacking direction contacts the second outer electrode 4 mounted to the second side face 17 of the piezo stack, outer electrode 4 being electrically connected to the second contact 12b of control voltage source 11 (FIG. 2B), that internal electrode 9 that is next in the stacking direction contacts the third outer electrode 5 mounted to the third side face 18 of the piezo stack, outer electrode 5, in turn, being electrically connected to the first contact 12a of control voltage source 11 (FIG. 2C), and that internal electrode 10 that is next in the stacking direction contacts the fourth outer electrode 6 mounted to the fourth side face 19 of the piezo stack, outer electrode 6, in turn, being electrically connected to the second contact 12b of control voltage source 11 (FIG. 2D). This sequence in the arrangement of internal electrodes 7–10 is cyclically continued in the stacking direction so that throughplating areas 14 are uniformly distributed over the entire piezo stack.

In principle, within the above specifications, it is possible to select an arbitrary contacting sequence within one cyclic period. Neither is it necessarily required to mount outer electrodes 3, 5 and 4, 6 of one group to opposed side faces 16–18 and 17–19 of the piezo stack, respectively. For reasons of symmetry and the resulting uniform distribution of the electrical fields and the tensile stress in piezoelectric actuator 1, it is advantageous, however, to arrange outer electrodes 3–6 of the two groups or polarities in an alternating manner along the circumference of the piezo stack, i.e., the side faces 16–19.

Furthermore, the piezoelectric plates 2 of the above-described exemplary embodiment have an approximately square surface area. However, the present invention is not limited to this specific embodiment; possible surface areas rather include rectangular, polygonal, or round forms. The number of outer electrodes 3–6 as well as the contacting of outer electrodes 3–6 with internal electrodes 7–10 is then carried out in an analogous manner to the exemplary embodiment of FIG. 1 and 2, which has been explained above in more detail.

In FIG. 1, furthermore, an undulated electrode 20 is exemplarily attached, or rather soldered to outer electrode 3. The three other outer electrodes 4–6 are also provided with an undulated electrode 20, correspondingly.

Figure 4B:
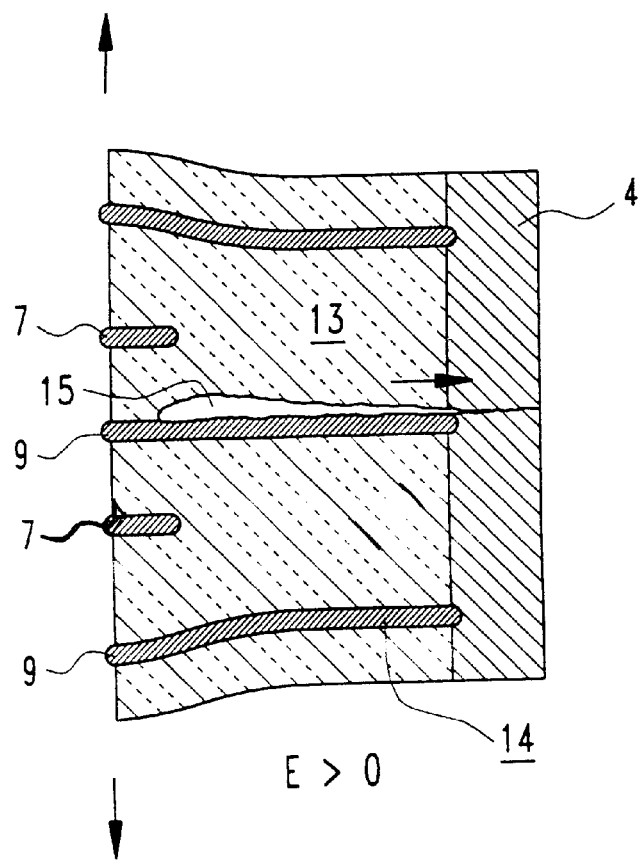
FIG. 4B shows a second illustration of detail IV of the piezoelectric actuator of FIG. 3 in an enlarged view to illustrate the formation of cracks in conventional piezoelectric actuators.

Undulated electrodes 20 are, in each case, soldered to the outer electrode 3 in those areas which are located in the middle between two internal electrodes 7 which are plated through to the outer electrodes 3, respectively. In the above described sequence in the arrangement of internal electrodes 7–10, the wavelength of undulated electrodes 20 is four times the distance between two consecutive internal electrodes. In the event of a possible formation of cracks 15 in the actuator, as is shown FIG. 4B, a crack in outer electrode 3–6 can be bridged by undulated electrode 20, and the reliable contacting of all internal electrodes 7–10 be guaranteed. For the undulated electrodes, sheet metal of electrically conductive material, preferably brass, having a thickness of 0.05 mm, is used.

Figure 3:
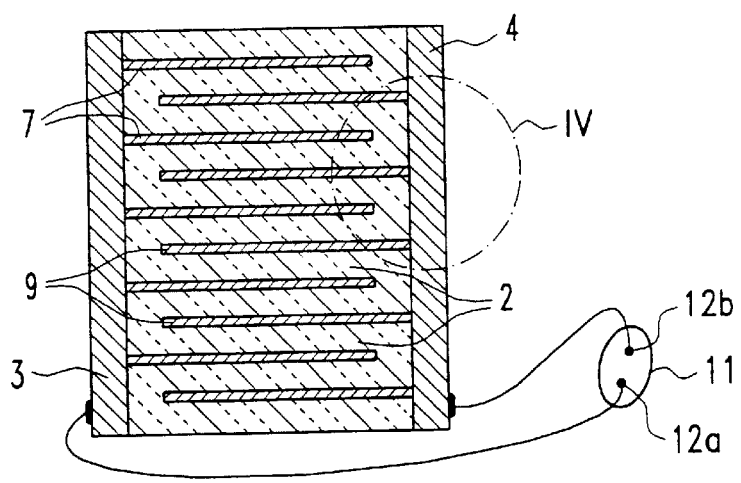
FIG. 3 shows a piezoelectric actuator in a sectional view according to the related art.

In the case of a conventional actuator 1 as is shown in FIG. 3, in contrast, the wavelength of such undulated electrodes 20 would only be twice the distance between two consecutive internal electrodes 7, 9. Because of this, there would be a risk that undulated electrodes 20 could be soldered to outer electrodes 3, 4 all-over, so that reliable crack bridging cannot be guaranteed.

What is claimed is:

1. A piezoelectric actuator, comprising:

a plurality of plates formed from a piezoelectric material and having a polarization direction running perpendicularly to a plate plane, each one of the plurality of plates being stacked one over another in a stack having a stacking direction with respect to the polarization direction;

a control voltage source including a first contact and a second contact;

a first group of outer electrodes electrically connected to the first contact;

a second group of outer electrodes electrically connected to the second contact, each one of the first group of outer electrodes and each one of the second group of outer electrodes being respectively attached to a different one of a plurality of side faces of the stack of piezoelectric plates; and a plurality of internal electrodes, each one of the plurality of internal electrodes being arranged between the plurality of plates in the stacking direction and alternately contacting the first group of outer electrodes and the second group of outer electrodes according to an arrangement in which at least one of the plurality of internal electrodes is electrically connected to the first contact and in which at least another one of the plurality of internal electrodes that is next in the stacking direction is electrically connected to the second contact, the plurality of internal electrodes contacting the first group of outer electrodes and the second group of outer electrodes in a cyclic sequence.

2. The piezoelectric actuator according to claim 1, wherein the first group of outer electrodes and the second group of outer electrodes are arranged in an alternating manner along a circumference of the stack.

3. The piezoelectric actuator according to claim 1, wherein a surface area of each one of the plurality of plates corresponds to a square shape.

4. The piezoelectric actuator according to claim 1, wherein the piezoelectric material is a lead circonate—lead titanate system.

5. The piezoelectric actuator according to claim 1, further comprising:

a plurality of undulated electrodes, each one of the plurality of undulated electrodes being mounted on an outer surface of a respective one of the first group of outer electrodes and the second group of outer electrodes.

6. A piezoelectric actuator, comprising:

a plurality of plates formed from a piezoelectric material and having a polarization direction running perpendicularly to a plate plane, each one of the plurality of plates being stacked one over another in a stack having a stacking direction with respect to the polarization direction;

a control voltage source including a first contact and a second contact;

a first group of outer electrodes electrically connected to the first contact;

a second group of outer electrodes electrically connected to the second contact, each one of the first group of outer electrodes and each one of the second group of outer electrodes being respectively attached to a different one of a plurality of side faces of the stack of piezoelectric plates; and a plurality of internal electrodes, each one of the plurality of internal electrodes being arranged between the plurality of plates in the stacking direction and alternately contacting the first group of outer electrodes and the second group of outer electrodes according to an arrangement in which at least one of the plurality of internal electrodes is electrically connected to the first contact and in which at least another one of the plurality of internal electrodes that is next in the stacking direction is electrically connected to the second contact, the plurality of internal electrodes contacting the first group of outer electrodes and the second group of outer electrodes in a cyclic sequence, and wherein a plurality of undulated electrodes, each one of the plurality of undulated electrodes being mounted on an outer surface of a respective one of the first group of outer electrodes and the second group of outer electrodes, and, wherein:

a wavelength of each one of the plurality of undulated electrodes is four times a distance between two consecutive ones of the plurality of internal electrodes, and each point at which each undulated electrode contacts the respective one of the first group of outer electrodes and the second group of outer electrodes is arranged between areas of the plurality of internal electrodes that are respectively plated through to the first group of outer electrodes and the second group of outer electrodes.

* * * * *

UNITED STATES PATENT AND TRADEMARK OFFICE
CERTIFICATE OF CORRECTION

PATENT NO. : 6,765,337 B1
DATED : July 20, 2004
INVENTOR(S) : Heinz et al.

It is certified that error appears in the above-identified patent and that said Letters Patent is hereby corrected as shown below:

Title page,
Item [*] Notice, delete "433" and insert -- 769 --.

Signed and Sealed this

Thirtieth Day of August, 2005

JON W. DUDAS
*Director of the United States Patent and Trademark Office*